US007623006B2

(12) United States Patent
Ezzeddine et al.

(10) Patent No.: US 7,623,006 B2

(45) **Date of Patent: *Nov. 24, 2009**

(54) POWER COMBINER/SPLITTER

(75) Inventors: Hilal Ezzeddine, Tours (FR); Philippe Leduc, Tours (FR); François Dupont, Tours (FR)

(73) Assignee: STMicroelectronics S.A., Montrouge (FR)

( * ) Notice: Subject to any disclaimer, the term of this patent is extended or adjusted under 35 U.S.C. 154(b) by 54 days.

This patent is subject to a terminal disclaimer.

(21) Appl. No.: 11/811,025

(22) Filed: Jun. 8, 2007

(65) Prior Publication Data

US 2007/0296519 A1 Dec. 27, 2007

(30) Foreign Application Priority Data

Jun. 22, 2006 (FR) .................................. 06 52586

(51) Int. Cl.
*H03H 7/38* (2006.01)

(52) U.S. Cl. ....................... 333/131; 333/112; 333/118; 333/24 R; 333/24 C

(58) Field of Classification Search ................. 333/112, 333/118, 24 R, 24 C, 131
See application file for complete search history.

(56) References Cited

U.S. PATENT DOCUMENTS

| | | | |
|---|---|---|---|
| 3,999,150 | A | 12/1976 | Caragliano et al. |
| 5,818,308 | A | 10/1998 | Tanaka et al. |
| 6,396,362 | B1 | 5/2002 | Mourant et al. |
| 6,765,455 | B1 | 7/2004 | De Lillo et al. |
| 2003/0080827 | A1 | 5/2003 | Chominski |
| 2003/0151881 | A1 | 8/2003 | Yue |
| 2004/0182602 | A1 | 9/2004 | Satoh et al. |
| 2005/0052257 | A1 | 3/2005 | Ezzeddine |
| 2005/0264273 | A1 | 12/2005 | Ezzedine |
| 2006/0087384 | A1 | 4/2006 | Ezzendine |
| 2007/0120622 | A1 | 5/2007 | Ezzeddine |
| 2007/0120637 | A1 | 5/2007 | Ezzeddine |

FOREIGN PATENT DOCUMENTS

| | | | |
|---|---|---|---|
| JP | 2003018039 | A | 1/2003 |

OTHER PUBLICATIONS

French Search Report from corresponding French Application No. 06/5258, filed Jun. 22, 2006.

Noureddine Boulejfen et al: "*Frequency-and Time-Domain Analyses of Nonuniform Lossy Coupled Transmission Lines with Linear and Nonlinear Terminations*" IEEE Transactions on Microwave Theory and Techniques, IEEE Service Center, Piscataway, NJ, US, vol. 48, No. 3,. Mar. 2000, XPO11037904 p. 367-379.

(Continued)

*Primary Examiner*—Robert Pascal
*Assistant Examiner*—Kimberly E Glenn
(74) *Attorney, Agent, or Firm*—Lisa K. Jorgenson; William R. McClellan; Wolf, Greenfield & Sacks, P.C.

(57) ABSTRACT

A distributed combiner/splitter having a first line formed of a first planar winding in a first conductive level and of a second planar winding in a second conductive level, and a second line formed of a third planar winding interdigited with the first winding in the first level, and of a fourth planar winding interdigited with the second winding in the second level, the windings having an increasing width from the outside to the inside.

18 Claims, 2 Drawing Sheets

OTHER PUBLICATIONS

Ohba Y et al: "*Directional Coupler With Coupled Nonuniform Transmission Line Represented By Lumped Brune Section And Uniform Transmission Line*", Electronics & Communications in Japan, Part III—Fundamental Electronic Science, Wiley, Hoboken, NJ, US, vol. 80, No., Apr. 4, 1997, pp. 71-81, XPOO0723465.

French Search Report dated Aug. 8, 2006 from French Application No. 05/53648.

French Search Report dated Aug. 2, 2006 from French Application No. 05/53652.

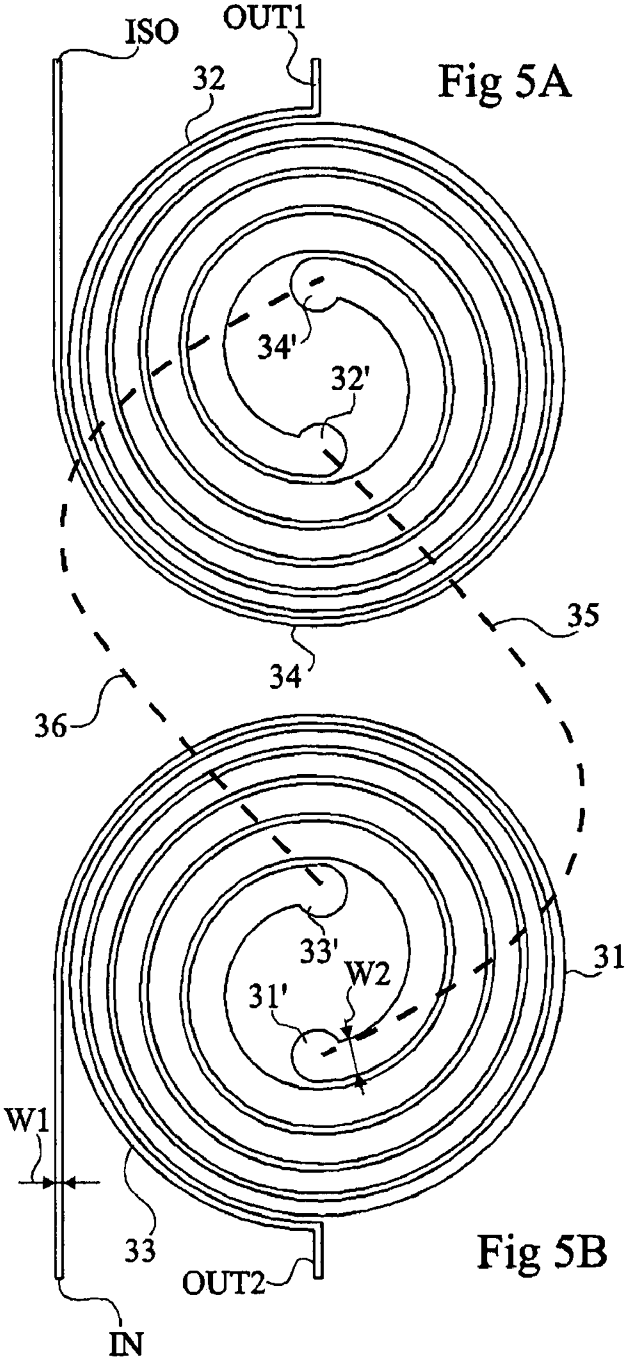
Fig 5A
Fig 5B
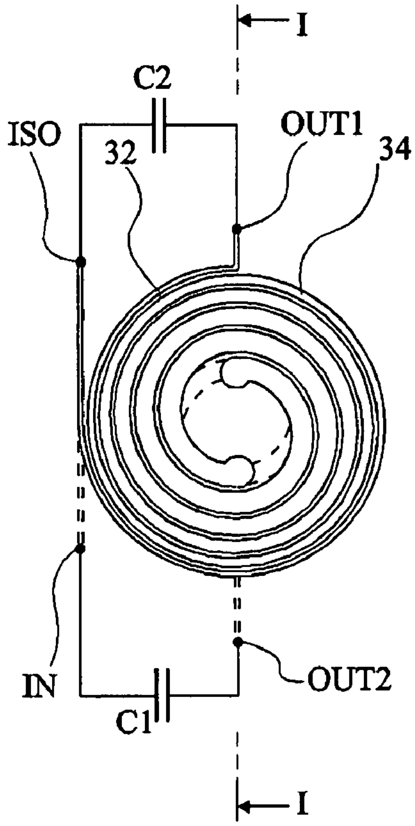
Fig 6
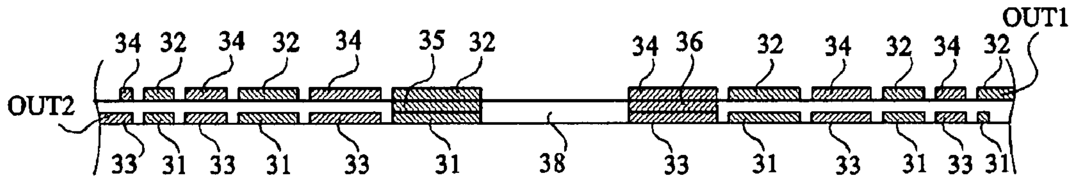
Fig 7

POWER COMBINER/SPLITTER

BACKGROUND OF THE INVENTION

1. Field of the Invention

The present invention generally relates to power combiners/splitters in a distributed or coupled line technology. Such devices are used to split an incoming power into two balanced paths or add two incoming powers in a common path. Such devices can generally be found in association with balanced power amplifiers, mixers, phase-shifters, most often to combine several powers obtained from several different amplification paths.

2. Discussion of the Related Art

FIG. 1 is a block diagram illustrating a power combiner/splitter (COMB/DIV) 1. This circuit comprises an access IN, arbitrarily said to be the input access, intended to receive a signal Pin with a power that is to be distributed (or to provide a combined signal), and two accesses OUT1 and OUT2, arbitrarily said to be output accesses, intended to provide distributed power signals Pout1 and Pout2 (or to receive signals with powers to be combined) in phase or in phase quadrature. Not only does circuit 1 have the function of equally distributing power Pin between output accesses Pout1 and Pout2 in phase or in phase quadrature, but also should ensure the isolation between these accesses. Such a device is most often bi-directional, that is, it may be used, according to its assembly in an electronic circuit, to combine two powers Pout1 and Pout2 in a single signal Pin or to equally distribute a power Pin in two powers Pout1 and Pout2.

The present invention more specifically relates to combiners/splitters having their distributed accesses (OUT1 and OUT2) in phase quadrature.

As compared with a coupler having the function of extracting a small part of a power transmitted for measurement purposes, a power combiner/splitter should respect phase imbalance and amplitude imbalance parameters between the distributed paths.

FIG. 2 is a schematic block diagram illustrating a conventional example of a radiofrequency transmission circuit using a combiner (combiner-assembled block 1 of FIG. 1). Combiner 1 is interposed between outputs OUT0 and OUT90 phase-shifted by 90° with respect to each other of two power amplifiers 11 and 12 (PA) of a radiofrequency transmission head 10. Impedance matching circuits 13 and 14 (MATCH), shown in dotted lines, may be interposed between amplifiers 11 and 12 and accesses OUT1 and OUT2 of the combiner. Each amplifier 11, 12 receives a radiofrequency signal RF0, RF90 originating from a phase shift circuit 13 (PHASE SHIFT), which itself receives two differential radiofrequency signals RFin+ and RFin− to be transmitted. Signals RFin+ and RFin− are in phase opposition with respect to each other. Circuit 10 is supplied with a generally D.C. voltage Valim.

Combiner 1 adds signals OUT0 and OUT90 to form a signal IN sent onto an antenna 16 for transmission. A coupler may be added to the combiner to extract data proportional to transmitted power Pout on access IN to possibly adjust the gains of amplifiers 11 and 12.

The same type of architecture may be used for a receive chain. In this case, the combined access (IN) is used as an input terminal while the two distributed accesses (OUT1 and OUT2) are used as phase-shifted output terminals (in phase quadrature) towards two reception inputs of a radiofrequency reception head.

To save the power consumed by the amplification circuits (in transmission or reception), the signals are most often distributed between two paths in phase quadrature. Thereby, the combiners/splitters are generally in phase quadrature for the distributed accesses.

The forming of combiners/splitters may use techniques with lumped elements (association of inductive and capacitive elements) or with distributed or coupled lines (conductive lines arranged sufficiently close to each other to generate an electromagnetic coupling).

FIG. 3 shows a conventional example of a combiner/splitter made in a distributed technology. A first conductive line 21 connects combined access terminal IN to one, OUT1, of the distributed access terminals. A second conductive line, 22, connects a second distributed access terminal OUT2 to a terminal ISO, generally left unconnected. According to whether terminal OUT2 is on the side of terminal IN or on the side of terminal OUT1, the distributed accesses are in phase quadrature or in phase.

In certain cases, terminal ISO is not left unconnected but is loaded with a standardized impedance (typically, 50 ohms). The combiner then becomes directional, that is, a signal entering through terminal IN (antenna 16, FIG. 2) is trapped by terminal ISO to avoid for this signal to reach the application (the amplifiers).

To obtain the combiner/splitter effect, the coupler thus formed should be at 3 dB so that the power of terminal IN is distributed by halves on each of terminals OUT1 and OUT2. In the architecture of FIG. 3, the length of each of lines 21 and 22 should correspond to one quarter of the wavelength (λ/4) of the work frequency of the combiner/splitter, that is, to one quarter of the wavelength of the central frequency of its passband.

A disadvantage of a conventional combiner/splitter such as illustrated in FIG. 3 is its bulk for rather low frequencies, which makes it, in practice, unusable in integrated circuits. For example, for a frequency on the order of one Gigahertz, currently corresponding to the frequencies used in mobile telephony, lines 21 and 22 should exhibit lengths of 34 mm each on a substrate of permittivity $\epsilon_r$=4.6.

Another disadvantage is that this length of the conductive lines generates high network losses.

It should be noted that a combiner/splitter is fundamentally different from a balun transformer (balun standing for balanced/unbalanced), which comprises one common-mode access and two differential-mode accesses. In particular, a balun does not enable obtaining a quadrature phase-shift, which is used in combiners to which the present invention applies.

Another problem in the forming of a combiner of the type to which the present invention applies is that the coupled lines should be compatible with the currents flowing between amplifiers 11 and 12 and the combiner. Such currents may, in the application to mobile telephony, reach several hundreds of milliamperes. This problem results in significant line widths which adversely affect the miniaturization.

SUMMARY OF THE INVENTION

The present invention aims at overcoming all or part of the disadvantages of conventional phase quadrature combiners/splitters.

Embodiments of the present invention more specifically aim at forming a phase quadrature combiner/splitter by using a thin layer technology of the type used in integrated circuit manufacturing.

Embodiments of the present invention also aim at decreasing the bulk of a combiner/splitter with respect to conventional distributed solutions.

Embodiments of the present invention also aim at decreasing the bulk for a given current intended to flow in the considered application.

To achieve all or part of these objects, as well as others, embodiments of the present invention provide a distributed combiner/splitter comprising:

a first line formed of a first planar winding in a first conductive level and of a second planar winding in a second conductive level; and a second line formed of a third planar winding interdigited with the first winding in the first level, and of a fourth planar winding interdigited with the second winding in the second level, said windings having an increasing width from the outside to the inside.

According to an embodiment of the present invention:

a first capacitive element connects the external ends of the first and third windings; and a second capacitive element connects the external ends of the second and fourth windings.

According to an embodiment of the present invention, the windings constitutive of a same line wind in reverse directions.

According to an embodiment of the present invention, the maximum width of the windings is selected according to the current acceptable by the combiner.

According to an embodiment of the present invention:

the first and third windings have a length difference of one quarter of a turn; and the second and fourth windings have a length difference of one quarter of a turn.

According to an embodiment of the present invention, the capacitive elements have values selected from a range between 0.1 and 10 picofarads.

According to an embodiment of the present invention, the capacitive elements are lumped elements.

Embodiments of the present invention also provide a method for manufacturing a combiner/splitter with two coupled lines, in which the lines are made in the form of planar conductive windings of increasing width from the outside to the inside in two levels stacked up on each other, each line comprising a winding in each level and the two windings of a same plane being interdigited with each other.

According to an embodiment of the present invention:

a first capacitive element is connected to connect first ends of the lines; and a second capacitive element is connected to connect second ends of the lines.

According to an embodiment of the present invention, the central ends of the windings of a same line are connected by a conductive via.

The foregoing and other objects, features, and advantages of the present invention will be discussed in detail in the following non-limiting description of specific embodiments in connection with the accompanying drawings.

BRIEF DESCRIPTION OF THE DRAWINGS

FIGS. 5A and 5B are top views of conductive levels taking part in an integrated embodiment of the coupled lines of the combiner/splitter of FIG. 4;

FIG. 6 is a top view of the coupled lines of the combiner/splitter according to an embodiment of the present invention; and FIG. 7 is a cross-section view along line I-I of FIG. 6.

DETAILED DESCRIPTION

Figure 1:
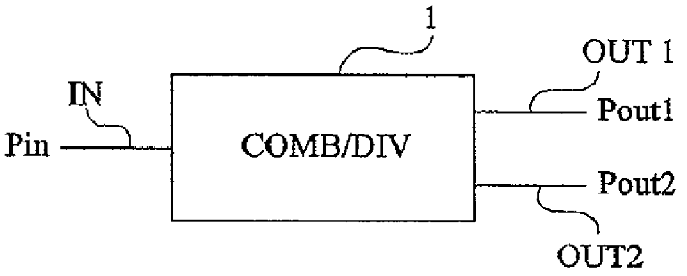
Fig 1 (Prior Art)
FIG. 1, previously described, is a block diagram illustrating a combiner/splitter of the type to which an embodiment of the present invention applies.
Figure 2:
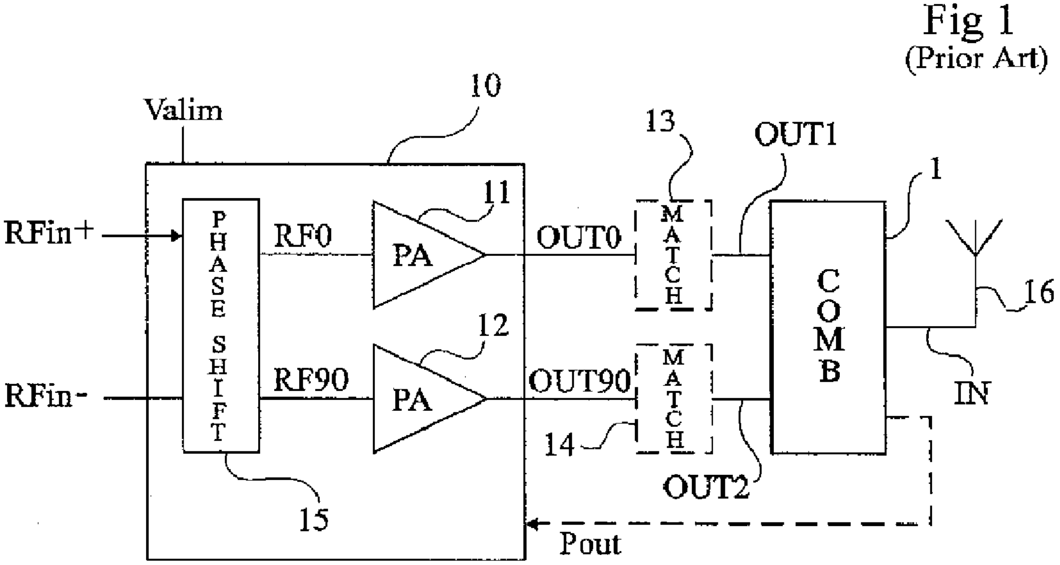
Fig 2 (Prior Art)
FIG. 2 is a schematic block diagram illustrating an example of an electronic circuit using a combiner of the type to which an embodiment of the present invention applies.
Figure 3:
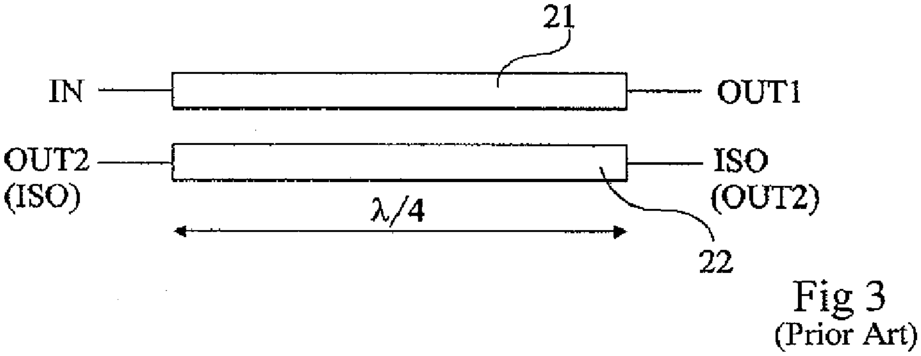
Fig 3 (Prior Art)
FIG. 3 shows a conventional example of coupled-line combiner/splitter.

For clarity, the same elements have been designated with the same reference numerals in the different drawings and, further, as usual in the representation of integrated circuits, the various drawings are not to scale.

Further, only those elements which are useful to the understanding of the present invention have been shown and will be described. In particular, the applications of a combiner/splitter of the present invention have not all been detailed, it being possible for such a combiner/splitter to be used to replace a conventional device in any application applying a 90° phase shift. Similarly, methods for forming thin layers by using integrated circuit manufacturing technologies have not been detailed, the present invention being compatible with conventional techniques.

Figure 4:
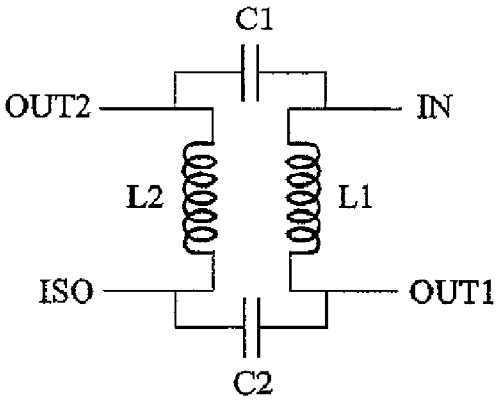
FIG. 4 shows the equivalent electric diagram of a combiner/splitter according to an embodiment of the present invention.

FIG. 4 shows the equivalent electric diagram of a combiner/splitter according to an embodiment of the present invention.

As previously, a first line defines a first inductive element L1 while a second line defines a second inductive element L2 coupled to the first one. The ends of the first inductive element respectively define combined access IN and one OUT1 of the distributed accesses. The ends of inductive element L2 respectively define second distributed access OUT2, phase shifted by 90° with respect to the signals of accesses IN and OUT1, and a terminal ISO generally loaded with a 50-ohm impedance or other according to the application. The ends defining accesses IN and OUT2 are connected by a first capacitive element C1 while the ends defining accesses OUT1 and ISO are connected by a second capacitive element C2.

Capacitive elements C1 and C2 enable, without modifying the line impedance, increasing the coupling between them, and accordingly the combiner/splitter performances. Elements C1 and C2 also enable shifting the operating band towards lower frequencies and ensuring the phase quadrature between accesses OUT1 and OUT2. Another effect of capacitive elements is that they enable setting the operating frequency band of the combiner.

Another effect of capacitive elements provided on the two sides is to make the structure symmetrical.

FIGS. 5A, 5B, 6 and 7 illustrate an embodiment of inductive elements L1 and L2 in the form of planar conductive windings to form a combiner/splitter according to an embodiment of the present invention. FIGS. 5A and 5B are simplified top views of two conductive levels used for this embodiment. FIG. 6 is a top view illustrating the stacked levels of FIGS. 5A and 5B. FIG. 7 is a cross-section view along line I-I of FIG. 6.

A feature of this embodiment is to form the coupled lines of the combiner/splitter in the form of planar conductive windings in two stacked levels, each level comprising two interdigited windings. Another feature is to provide an increasing width of the tracks from the outside of each winding to the center.

The present invention takes advantage from the current density distribution in a conductive winding, which is greater at the center of the winding than at its periphery. This amounts to taking into account the fact that a combiner is a structure poorly adapted to carrying off the power that it dissipates by Joule effect both due to its compactness and to the low heat conductivity of currently-used dielectrics. Increasing the track width at the center locally increases the exchange surface area between the heat sources and their environment, and thus favors the heat dissipation.

Further, the fact that the combiner conducts variable currents generates a variable orthogonal magnetic field. This results in the occurrence of eddy currents which oppose the general current on the external portion of the spirals and add thereto on the internal portion. The localization of the current at the internal border of the spirals results in that only part of the conduction section is used, which increases resistive losses.

Thus, by providing an increasing width towards the center of the winding, an embodiment of the present invention enables sizing a combiner/splitter of reduced bulk for a given current with respect to an embodiment with a constant track width.

Embodiments of the present invention use tracks of variable width such that the conductive windings are wider at their center than at their periphery.

As illustrated in FIGS. 5A and 5B, inductive element L1 is formed of two planar windings 31 and 32 formed in first (FIG. 5A) and second (FIG. 5B) conductive levels (for example, two metallization levels of an integrated circuit) which are superposed and separated by an insulator 38 (FIG. 7). Inductive element L2 is also formed of two planar windings 33 and 34, respectively in the first and second conductive windings. Winding 33 is interdigited (interlaced) with winding 31 while winding 34 is interdigited with winding 32. The external ends of windings 31, 32, 33, and 34 respectively define accesses IN, OUT1, OUT2, and ISO. Internal ends 31' and 32' of windings 31 and 32 are connected by a conductive via 35 (FIG. 7 and in dotted lines in FIGS. 5A and 5B). Internal ends 33' and 34' of windings 33 and 34 are interconnected by a conductive via 36. The stacking order of the conductive levels doesn't matter. Other conductive and/or insulating levels not shown in FIG. 7 may be provided according to the application.

In the shown example and once the structure is finished (FIG. 6), windings 31 and 33 wind, in top view and as seen from the outside, clockwise, while windings 32 and 34 wind in the reverse direction. The opposite is of course possible, provided for the windings forming a same line to wind in reverse directions (from the outside) so that the current of a same line winds in the same direction along the entire line.

The fact of stacking up and interdigiting different windings enables a first coupling effect of the first winding on itself due to the second winding formed in the lower or upper level, and a second coupling effect by the fact that the winding is interdigited with a winding of the other line. This increase in the coupling coefficient with respect to conventional techniques enables, among others, for developed lengths of the lines forming the windings to be lower than one quarter of the wavelength of the work frequency of the coupler.

The fact of providing increasing lengths of conductive lines between the line access (width W1, FIG. 5B) and its inner end (width W2) enables, without increasing the combiner size, having wider tracks at the center, where the current is greater.

The line widths are preferably the same at all accesses and the same at all internal ends.

According to an embodiment of the present invention, capacitive elements C1 and C2 (FIGS. 4 and 6) are made in the form of lumped non-distributed elements.

In the preferred embodiment illustrated in FIGS. 4 to 7, the number of turns of each conductive level differs by one quarter of a turn. This enables making the external ends of the winding defining the combiner/splitter accesses close to one another. It is then possible to connect capacitive elements C1 and C2 to these ends, as illustrated in FIG. 6, without lengthening the coupled lines. An advantage is that this enables not having long connections to connect the capacitances and thus decreases the risk of deterioration of the combiner performances.

The passband of the combiner/splitter depends on the number of turns of the windings (and thus on the inductance value) as well as on the value of the capacitive elements.

For a given work frequency (central frequency of the passband of the combiner/splitter), the shorter the windings, the greater the values of the associated capacitive elements. In applications at high frequency (greater than 100 MHz) more specifically aimed at by embodiments of the present invention, the capacitive elements will have values ranging between 0.1 and 10 picofarads.

According to a first embodiment of the variable-width windings, pattern definition software usual in integrated and printed circuit technology is used, defining the different characteristic points required by the software.

According to another embodiment, the variable-width windings are formed by rectilinear segments placed end-to-end and having their parameters determined as follows.

A segment $S_i$ (with i ranging from 1 to N*T, where N represents the number of segments per turn and T the number of turns of the concerned winding) is defined by an end point $P_i$ and a width $W_i$, the other end being defined by point $P_{i-1}$ of the preceding segment $S_{i-1}$.

The polar coordinates of a point $P_i$ of a segment $S_i$ of a winding in a reference frame, with origin O representing the center of the structure, are obtained from width $W_{i-N}$ of segment $S_{i-N}$ of same angle $\theta_i$ ($\theta_i=\theta_{i-N}$) at the preceding turn of this winding and from width $W_{i-N/2}$ at the preceding half-turn. Embodiment of the present invention take advantage of the fact that the width of a segment $S_{i-N/2}$ at the preceding half-turn corresponds to the width of the segment of the other winding located between current segments $S_i$ and the segment of the preceding winding $S_{i-N}$ (that is, of segment $S_{i-3N/2}$ of the other winding).

Modulus $R_i$ in polar coordinates of point $P_i$ is obtained from the modulus of point $P_{i-N}$ of same angle $\theta_{i-N}$ at the preceding turn:

$$R_i=R_{i-N}+W_{i-N}+W_{i-N/2}+2*D, \quad \text{(equation 1)}$$

where D shows the constant interval between windings.

Width $W_i$ of current segment $S_i$ is obtained from that $W_{i-1}$ of the previous segment $S_{i-1}$:

$$W_i=W_{i-1}+(W\text{min}-W\text{max})/(N(T-1)+1), \quad \text{(equation 2)}$$

where Wmax designates the maximum width (W2, FIG. 5B) and Wmin designates the minimum width (W1).

Angle $\theta_i$ in polar coordinates of point $P_i$ is then obtained from that $\theta_{i-1}$ of point $P_{i-1}$ of the previous segment $S_{i-1}$:

$$\theta_i=\theta_{i-1}+2\pi/N. \quad \text{(equation 3)}$$

If need be, the rectangular coordinates (abscissa $X_i$ and ordinate $Y_i$) of point $P_i$ can then be obtained:

$$X_i=R_i*\cos\theta_i; \text{ and}$$

$$Y_i=R_i*\sin\theta_i.$$

In the above example, the case where point $P_i$ is on the inner edge of the spiral is considered. If the segments are defined from outer points $P_i$, it is enough to add width $W_i$ in equation 1 for obtaining modulus $R_i$.

Since the calculation of the point coordinates takes into account the preceding turn, the first turn of each winding preferentially is of constant width corresponding to maximum width Wmax. This amounts to considering that, for the first N segments, the calculation of modulus $R_i$ is obtained from the modulus of the preceding point $P_{i-1}$:

$R_i=R_{i-1}+(2*Wmax+2*D)/N$, with $R_0$ being selected according to the desired internal radius, for example, according to a space required at the center by the application (for example, to form vias for transferring the internal end contacts of the windings to the outside). The turn of constant width may however be virtual and not be formed in the concerned conductive level.

Similarly, an identical number of segments N*T for the two windings, corresponding to a number of full turns, has been assumed. In practice, and as illustrated in the drawings, the pattern of each winding is stopped in the last turn, for a value of i ranging between 1+(N−1)*T and N*T, according to the needs of connection of the external ends of the windings.

As a specific example of embodiment, to form a combiner/splitter at a 2-GHz work frequency with windings of 2.25 turns each, each of the capacitive elements has a capacitance of 1 picofarad. The same combiner/splitter may be formed with windings of 2.75 turns and capacitive elements of 0.25 picofarad.

According to another specific example of embodiment applied to a 1-GHz work frequency, a combiner/splitter such as described in relation with the previous drawings may have the following characteristics:

developed length of each winding: 500 μm;

minimum width W1 of the lines: 10 μm;

maximum width W2 of the lines: 40 μm;

interval between the lines of the two interdigited windings on a same plane: 10 μm; and line thickness: less than 10 μm.

Another advantage of embodiments of the present invention is that the lengths of the coupled lines need not be equal to one quarter of the wavelength of the working frequency.

Another advantage of embodiments of the present invention is that by the stacking up of the windings, the combiner bulk is further decreased.

Another advantage of embodiments of the present invention is that by the provision of lines of increasing width from the outside to the inside, the combiner bulk is further decreased for a given work current range.

Another advantage of embodiments of the present invention is that the phase and amplitude balance is ensured.

Another advantage of embodiments of the present invention is that the structure thus obtained is directional (no signal on terminal ISO).

Of course, the present invention is likely to have various alterations, modifications, and improvements which will readily occur to those skilled in the art. In particular, the dimensions to be given to the coupled lines (length, width, and section) depend on the application and are within the abilities of those skilled in the art according, in particular, to the desired line resistance and to the work frequency of the combiner/splitter as well as to the work current range.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A distributed combiner/splitter comprising:

a first line formed of a first planar winding in a first conductive level and of a second planar winding in a second conductive level; and a second line formed of a third planar winding interdigited with the first winding in the first level, and of a fourth planar winding interdigited with the second winding in the second level, said windings having an increasing width from the outside to the inside.

2. The combiner/splitter of claim 1, wherein:

a first capacitive element connects external ends of the first and third windings; and a second capacitive element connects external ends of the second and fourth windings.

3. The combiner/splitter of claim 1, wherein the windings constitutive of a same line wind in reverse directions.

4. The combiner/splitter of claim 1, wherein a maximum width of the windings is selected according to a current acceptable by the combiner.

5. The combiner/splitter of claim 1, wherein:

the first and third windings have a length difference of one quarter of a turn; and the second and fourth windings have a length difference of one quarter of a turn.

6. The combiner/splitter of claim 2, wherein the capacitive elements have values selected from a range between 0.1 and 10 picofarads.

7. The combiner/splitter of claim 6, wherein the capacitive elements are lumped elements.

8. A method for manufacturing a combiner/splitter with two coupled lines, wherein the lines are made in the form of planar conductive windings of increasing width from the outside to the inside in two levels stacked up on each other, each of said lines comprising one of said windings in each of said levels and the two windings of a same plane being interdigited with each other.

9. The method of claim 8, wherein:

a first capacitive element is connected to connect first ends of the lines; and a second capacitive element is connected to connect second ends of the lines.

10. The method of claim 8, wherein central ends of the windings of each of said coupled lines are connected by a conductive via.

11. An electrical power combiner/splitter with distributed lines, comprising:

a first line including a first planar winding in a first conductive level and a second planar winding in a second conductive level; and a second line including a third planar winding interdigitated with the first planar winding in the first conductive level and a fourth planar winding interdigitated with the second planar winding in the second conductive level, wherein said windings have an increasing width from outside to inside.

12. The power combiner/splitter of claim 11, further comprising a first capacitive element connecting external ends of the first and third planar windings and a second capacitive element connecting external ends of the second and fourth planar windings.

13. The power combiner/splitter of claim 11, wherein the first and second planar windings wind in opposite directions and wherein the third and fourth planar windings wind in opposite directions.

14. The power combiner/splitter of claim 11, wherein the first and third planar windings have a length difference of one-quarter turn and wherein the second and fourth planar windings have a length difference of one-quarter turn.

15. The power combiner/splitter of claim 14, wherein central ends of the first and second planar windings are connected by a first conductive via and wherein central ends of the third and fourth planar windings are connected by a second conductive via.

16. A method for manufacturing an electrical power combiner/splitter with two coupled lines, comprising:

forming a first line including a first planar winding in a first conductive level and a second planar winding in a second conductive level; and forming a second line including a third planar winding interdigitated with the first winding in the first level and a fourth planar winding interdigitated with the second winding in the second level, wherein said windings are formed with an increasing width from outside to inside.

17. The method of claim 16, further comprising connecting a first capacitive element to external ends of the first and third planar windings and connecting a second capacitive element to external ends of the second and fourth planar windings.

18. The method of claim 16, further comprising connecting central ends of the first and second planar windings by a first conductive via and connecting central ends of the third and fourth planar windings by a second conductive via.

* * * * *